United States Patent
Kragick

(10) Patent No.: US 6,259,648 B1
(45) Date of Patent: Jul. 10, 2001

(54) METHODS AND APPARATUS FOR IMPLEMENTING PSEUDO DUAL PORT MEMORY

(75) Inventor: Nathan Andrew Kragick, Beavercreek, OH (US)

(73) Assignee: Systran Corporation, Dayton, OH (US)

(*) Notice: Subject to any disclaimer, the term of this patent is extended or adjusted under 35 U.S.C. 154(b) by 0 days.

(21) Appl. No.: 09/531,796

(22) Filed: Mar. 21, 2000

(51) Int. Cl.[7] ....................................... G11C 8/00
(52) U.S. Cl. .................. 365/230.05; 365/189.03
(58) Field of Search ........................ 365/230.05, 189.03

(56) References Cited

U.S. PATENT DOCUMENTS

| | | |
|---|---|---|
| 5,371,877 | 12/1994 | Drako et al. . |
| 5,761,147 | 6/1998 | Lindner et al. . |
| 5,781,480 | 7/1998 | Nogle et al. . |
| 5,838,631 * | 11/1998 | Mick ................................ 365/233 |

FOREIGN PATENT DOCUMENTS 471932   1/1997  (EP) .

* cited by examiner

Primary Examiner—David Nelms
Assistant Examiner—M. Tran
(74) Attorney, Agent, or Firm—King and Schickli PLLC

(57) ABSTRACT

A pseudo dual port memory is constructed using a zero bus turnaround random access memory (RAM) wherein data words stored in the RAM each make up a plurality of data words for the pseudo dual port memory. Words written to the dual port memory are accumulated to assemble a single RAM word which is written into an addressed location within the RAM. Words read from the RAM correspondingly make up a plurality of data words for the dual port memory and are stored and multiplexed out as individual words. In the illustrated embodiment, each RAM word comprises two dual port memory words; however, other multiples, preferably powers of 2, can be used in the present invention such that each RAM word can comprise 4, 8, 16, etc. dual port memory words.

19 Claims, 6 Drawing Sheets

METHODS AND APPARATUS FOR IMPLEMENTING PSEUDO DUAL PORT MEMORY

BACKGROUND OF THE INVENTION

The present invention relates in general to computer circuitry and, more particularly, to a method and apparatus for implementing a "pseudo" dual port memory from a single port zero bus turnaround random access memory (RAM).

Dual port memories are useful for numerous applications and are particularly well suited for communications and multiprocessor systems. For example, communications applications known as Asynchronous Transfer Mode (ATM) require large amounts of data to be transferred between two processing devices which is easily accomplished using dual port memories. And, in multiprocessor systems, dual port memories enable one processor to write data into an array while another processor can read data out of the array.

One specialized form of dual port memory is a dual port first-in first-out (FIFO) circuit. As its name implies, information is written into a FIFO circuit in sequence and read out of the circuit in the same sequence after some delay. A FIFO circuit has one port through which data is written and one port through which data is read.

Dual port random access memories (RAMs) are constructed using a variety of techniques. In a first conventional technique, each memory cell is truly dual port and thus requires eight transistors. Because eight transistor dual port memory cells make the memory array itself quite large, integrated circuit memories based on this technique are expensive. A second technique utilizes standard single port static RAM cells with a partitioned array. If both ports simultaneously attempt to access the same partition, then one of the accesses must be delayed. As the number of partitions increases, the likelihood that a collision will occur decreases, but the cost increases due to the extra decoding and collision detection circuitry. A third technique accesses a single port RAM at twice the speed of an external clock signal such that one port is accessed during a first portion of the clock cycle and the other port is accessed during the second portion of the clock cycle.

While such known techniques provide dual port memories, some utilizing single port memories for their construction, there is a continuing need to advance the art by providing alternate methods and apparatus for producing dual port memories. Preferably, such dual port memories would utilize single port RAMs yet provide dual port memories that are inexpensive and also fast.

SUMMARY OF THE INVENTION

The methods and apparatus of the present invention currently meet this need by providing a pseudo dual port memory using a zero bus turnaround random access memory (RAM) wherein data words stored in the RAM each comprise a plurality of data words for the pseudo dual port memory. Thus, words written to the dual port memory are accumulated to assembly a single RAM word which is written into an addressed location within the RAM. And, words read from the RAM also make up a plurality of data words for the dual port memory and are stored and multiplexed out as individual words. In the illustrated embodiment, each RAM word comprises two dual port memory words; however, other multiples, preferably powers of 2, can be used in the present invention such that each RAM word can comprise, 4, 8, 16, etc. dual port memory words.

In accordance with one aspect of the present invention, a pseudo dual port memory comprises a single port zero bus turnaround random access memory (RAM) storing M bit data words. At least one data input register provides at least two subgroups with each of the subgroups having M/2 data input storage locations and M data input storage locations of the at least one data input register are coupled to M data input leads of the RAM. At least one data output register provides two subgroups with each of the subgroups having M/2 data output storage locations and M data output storage locations of the at least one data output register are coupled to M data output leads of the RAM. Memory addressing circuitry is coupled to address leads of the RAM. Control circuitry is coupled to the RAM, the at least one data input register and the at least one data output register. The control circuitry performs a data write by setting a write address within the memory addressing circuitry and writing a first data word having M/2 bits into a first one of the at least two subgroups of the at least one data input register on a first clock pulse, writing a second data word having M/2 bits into a second one of the at least two subgroups of the at least one data input register on a second clock pulse, and on a third clock pulse, writing data from the first and second ones of the at least two subgroups of the at least one data input register into a storage location in the RAM corresponding to the write address.

The control circuitry further may interleave data reads with data writes by setting a read address within the memory addressing circuitry simultaneously with the writing of the second one of the at least two subgroups of the at least one data input register, and reading a data word having M bits from a location corresponding to the read address into the two subgroups of the at least one data output register on a fourth clock pulse. In a currently preferred embodiment, the pseudo dual port memory performs a FIFO operation. For the FIFO application, the memory addressing circuitry comprises a write counter and a read counter. For each write operation of the RAM for the FIFO, the control circuitry increments the write counter, and for each read operation of the RAM for the FIFO, the control circuitry increments the read counter. For the FIFO application, the pseudo dual port memory may further comprise a word counter which is incremented by 2 for each write operation of the RAM for the FIFO and decremented by 2 for each read operation of the RAM for the FIFO. The at least one data input register may comprise at least two data input registers, each having M/2 data input storage locations. In a currently preferred embodiment, the at least one data input register comprises first, second and third data input registers each having M/2 data input storage locations with the first and second data input registers or the second and third data input registers being selectively coupled to M data input leads of the RAM. The at least one data output register may comprise first and second data output registers each having M/2 data output storage locations, the first and second data output registers being coupled to M data output leads of the RAM.

In accordance with another aspect of the present invention, a pseudo dual port memory comprises a single port zero bus turnaround random access memory (RAM) storing M bit data words. At least one data input register is provided and has at least M data input storage locations and provides X subgroups each having M/X data input storage locations where X is a power of 2. M of the at least M data input storage locations of the at least one data input register are coupled to M data input leads of the RAM. At least one data output register is provided and has M data output storage locations and provides X subgroups each having M/X of the data storage locations. The data output register is coupled to M data output leads of the RAM. Memory addressing circuitry is coupled to address leads of the RAM. Control circuitry is coupled to the RAM, the at least one data input register and the at least one data output register. The control circuitry performs a data write by writing a first data word having M/X bits into a first one of the X subgroups of the at least M data storage locations of the at least one data input register on a first clock pulse, writing second through X data words each having M/X bits into second through X ones of the X subgroups of the at least M data storage locations of the at least one data input register on second through X clock pulses, setting a write address within the memory addressing circuitry on an X−1 clock pulse and writing data written into the first through X subgroups of the at least M data storage locations of the at least one data input register into a location corresponding to the write address of the RAM on an X+1 clock pulse.

The control circuitry may further interleave data reads with data writes by setting a read address within the memory addressing circuitry on the X clock pulse and reading a data word having M bits from a location corresponding to the read address into the X subgroups of the at least one data output register on the X+2 clock pulse. In a currently preferred embodiment, the pseudo dual port memory performs a FIFO operation. For the FIFO operation, the memory addressing circuitry comprises a write counter and a read counter, and for each write operation of the RAM the control circuitry increments the write counter, and for each read operation of the RAM the control circuitry decrements the read counter. For the FIFO application, the pseudo dual port memory may further comprise a word counter which is incremented by X counts for each write operation of the RAM and is decremented by X counts for each read operation of the RAM.

In accordance with yet another aspect of the present invention, a method for operating a single port memory to form a pseudo dual port memory comprises providing a single port zero bus turnaround random access memory (RAM) storing M bit data words. At least one data input register with at least two subgroups of data input storage locations each having M/2 data input storage locations is provided. M storage locations of the at least one data input register are coupled to M data input leads of the RAM. At least one data output register with two subgroups of data output storage locations each having M/2 data output storage locations is provided. M data output storage locations of the at least one data output register are coupled to M data output leads of the RAM. Memory addressing circuitry is provided. A write address is set into the memory addressing circuitry on a first clock pulse, a first data word having M/2 bits is written into a first subgroup of the at least one data input register on the first clock pulse, a second data word having M/2 bits is written into a second subgroup of the at least one data input register on a second clock pulse, and the first and second data words are written into a storage location corresponding to the storage address within the RAM on a third clock pulse.

The method may further comprise interleaving data reads with data writes by setting a read address into the memory addressing circuitry simultaneously with writing the second data word, and reading two M/2 data bit words from a location corresponding to the read address into the two subgroups of the at least one data output register on a fourth clock pulse. The method may be used to perform a FIFO operation by providing a write counter within the memory addressing circuitry for receiving the write address. A read counter is provided within the memory addressing circuitry for receiving the read address. The write counter is incremented for each write operation of the RAM, and the read counter is decremented for each read operation of the RAM. For FIFO operation, a word counter may also be provided with the word counter being incremented by 2 for each write operation of the RAM, and decremented by 2 for each read operation of the RAM.

In accordance with still another aspect of the present invention, a method for operating a single port memory to form a pseudo dual port memory comprises providing a single port zero bus turnaround random access memory (RAM) storing M bit data words. At least one data input register is provided and has at least M data input storage locations, the data input storage locations being divisible into X subgroups of the at least M data input storage locations where X is a power of 2. M of the at least M data input storage locations of the at least one data input register are coupled to M data input leads of the RAM. At least one data output register having M data output storage locations is provided with the M data output storage locations being divisible into X subgroups of data output storage locations. M data output storage locations of the data output register are coupled to M data output leads of the RAM. Memory addressing circuitry is coupled to address leads of the RAM. A first data word having M/X bits is written into a first one of the X subgroups of the M data storage locations of the at least one data input register on the first clock pulse. Second through X data words each having M/X bits are written into second through X ones of the X subgroups of the at least M data storage locations of the at least one data input register on second through X clock pulses. A write address is set within the memory addressing circuitry on an X−1 clock pulse. Data written into the first through X subgroups of the M data storage locations of the at least one data input register is written into a RAM location corresponding to the write address of the RAM on an X+1 clock pulse.

The method may further comprise interleaving data reads with data writes by setting a read address within the memory addressing circuitry on the X clock pulse and reading a data word having M bits from a location corresponding to the set read address into the X subgroups of the at least one data output register on the X+2 clock pulse. The method may be used to perform a FIFO operation by providing a write counter within the memory addressing circuitry for receiving the write address. A read counter is provided within the memory addressing circuitry for receiving the read address. The write counter is incremented for each write operation of the RAM for the FIFO, and the read counter is decremented for each read operation of the RAM for the FIFO. For the FIFO application, a word counter may also be provided with the word counter being incremented by X counts for each write operation of the RAM, and decremented by X counts for each read operation of the RAM.

DETAILED DESCRIPTION OF THE INVENTION

Figure 1:
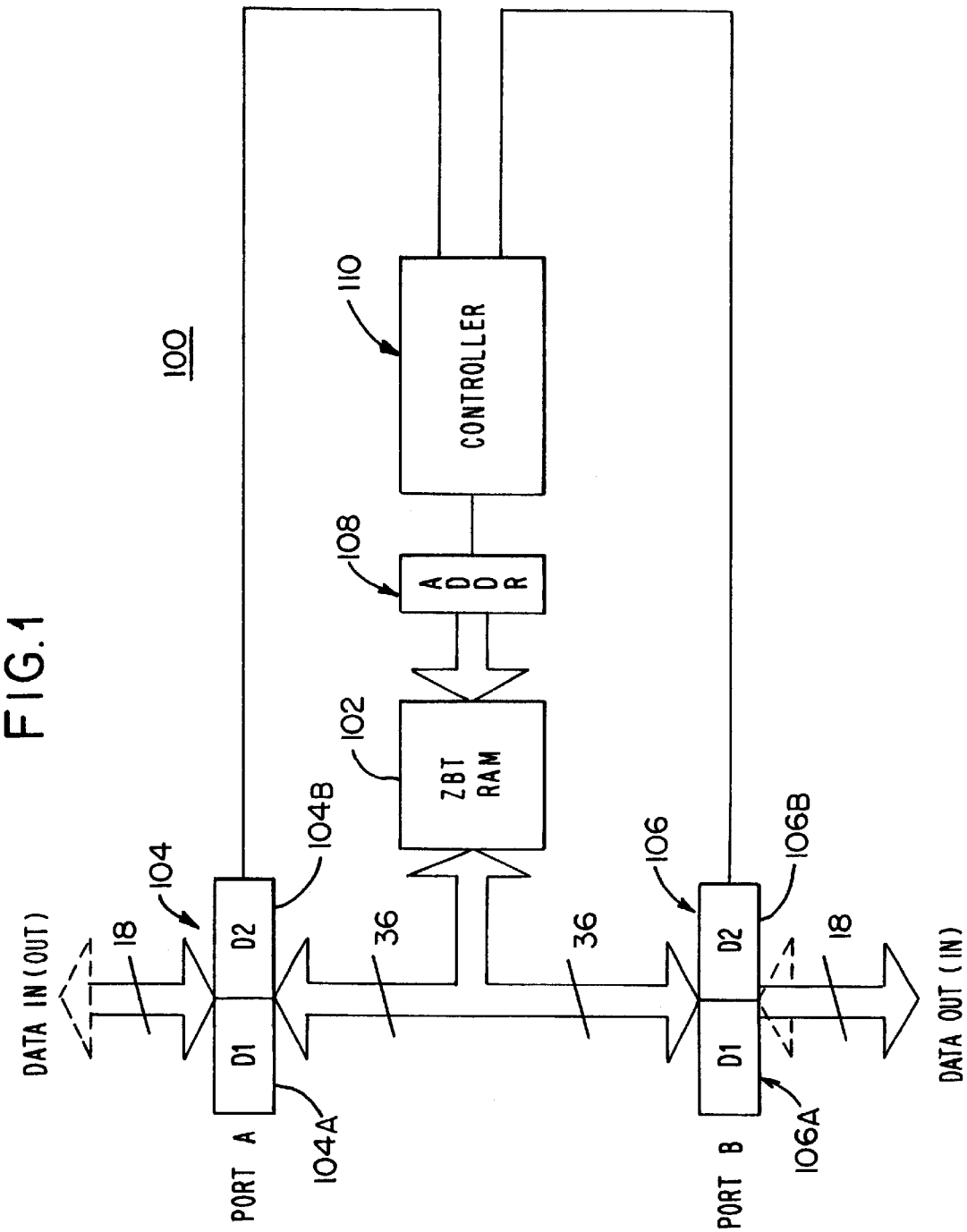
FIG. 1 is a block diagram of a pseudo dual port memory operable in accordance with the present invention.

While the present invention is generally applicable and can be applied to pseudo multi-port memories having any reasonable number of ports, it will be described herein with primary reference to a pseudo dual port memory. Reference will now be made to FIG. 1 for description of a pseudo dual port memory 100 operable in accordance with the present invention. The memory 100 is constructed using a single port zero bus turnaround random access memory 102 (RAM) which stores data words having M bits each. In a working embodiment of the present invention, a zero bus turnaround RAM sold by Samsung Electronics under the trademark NtRAM™ with M=36 was used as the memory 102, although other commercially available zero bus turnaround RAMs having different word sizes can be used in the present invention.

At least one data input register 104 has at least M data input storage locations and provides X subgroups each having M/X of the at least M data input storage locations, where X is a power of 2, with M of the at least M data input storage locations of the data input register 104 being coupled to M data input leads of the memory 102. In the embodiment of the pseudo dual port memory 100 illustrated in FIG. 1, two data input registers 104A (D1), 104B (D2) each having M/2=18 bits are used, however, other input data register arrangements will be described and other input data register arrangements will be suggested to those skilled in the art from a review of the present description.

At least one data output register 106 has M data output storage locations and provides X subgroups of the data output storage locations, each subgroup having M/X output storage locations, with the data output register being coupled to M data output leads of the memory 102. In the embodiment of the pseudo dual port memory 100 illustrated in FIG. 1, two data output registers 106A, 106B each having M/2= 18 are used, however, other data output register arrangements will be suggested to those skilled in the art from the present description. Memory addressing circuitry 108 is coupled to address leads of the memory 102. Control circuitry 110 is coupled to the memory 102, the data input register 104 and the data output register 106.

The control circuitry 100, preferably a programmable logic device such as a field programmable gate array (FPGA—a Xilinx Virtex XCV300 FPGA was used in a working embodiment of the present invention) or an application specific integrated circuit (ASIC), performs a data write by writing a first data word having M/X bits into a first one of the X subgroups of the M data storage locations of the at least one data input register on a first clock pulse, writing second through X data words each having M/X bits into second through X ones of the X subgroups of the M data storage locations of the at least one data input register on second through X clock pulses, setting a write address within the memory addressing circuitry on an X−1 clock pulse and writing data written into the first through X subgroups of the M data storage locations of the at least one data input register into a location corresponding to the write address of the memory on an X+1 clock pulse. In the embodiment of the pseudo dual port memory 100 illustrated in FIG. 1, the control circuitry 110 sets the write address into the memory addressing circuitry 108 and writes a first data word having M/2 bits into a first one of the two subgroups of the at least one data input register, i.e., the data input register 104A, on a first clock pulse, writes a second data word having M/2 bits into a second one of the at least two subgroups of the at least one data input register, i.e., the data input register 104B, on a second clock pulse and, on a third clock pulse, writes data written into the data input registers 104A, 104B into a storage location in the memory 102 which corresponds to the write address.

To provide the fastest operation of the pseudo dual port memory 100, the control circuitry preferably interleaves data reads with data writes by setting a read address within the memory addressing circuitry on the X clock pulse which is the same clock as an immediately preceding data read is performed (if any). These operations are performed at the same time that the write of M/X bits into an X one of the X subgroups of the at least one data input register is performed. A data word having M bits is then read from a location corresponding to the read address into the X subgroups of the at least one data output register on the X+2 clock pulse. In the embodiment of the pseudo dual port memory illustrated in FIG. 1, the control circuitry 110 interleaves data reads with data writes by setting a read address within the memory addressing circuitry 108 on the same clock as an immediately preceding read is performed (if any). For example, ra1 is written on the same clock pulse as the data for ra0 (r0&r1) is read, see FIG. 2. These operations are performed at the same time that the write of the second one of the at least two subgroups of the at least one data input register 104 is preformed (w1 and ra0 are written during the second clock pulse, see FIG. 2), and a data word having M bits is read from a location corresponding to the read address into the two subgroups of the at least one data output register 106 on a fourth clock pulse (r0&r1 for ra0, see FIG. 2).

Figure 2:
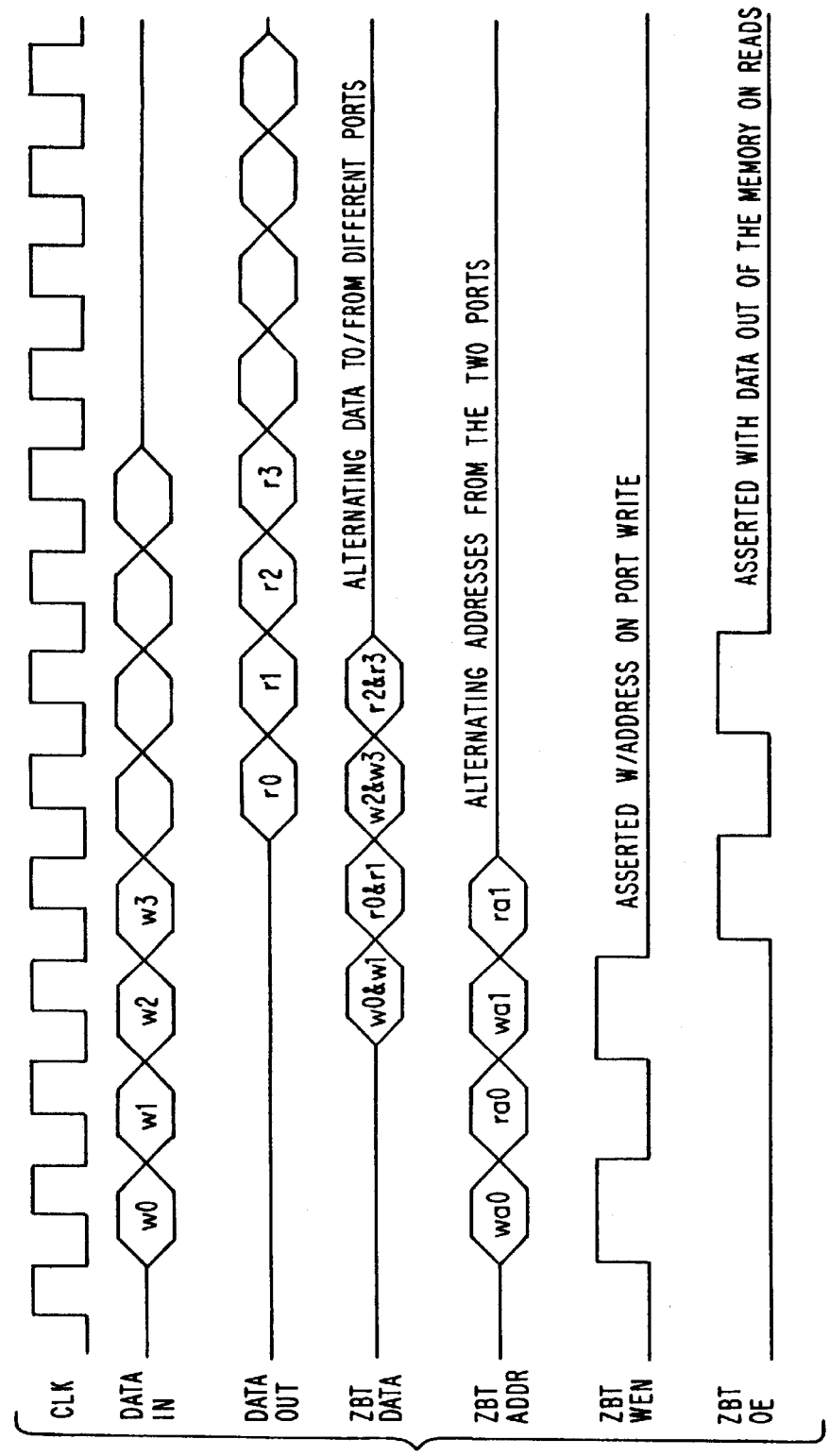
FIG. 2 is a timing diagram for operation of the pseudo dual port memory of FIG. 1 as a pseudo dual port memory FIFO circuit.

While the pseudo dual port memory 100 can be constructed to provide two ports which can be used for either writing or reading the memory 100, as suggested by the dotted line arrow heads for DATA IN (OUT) and DATA OUT (IN) in FIG. 1 as generally outlined above, it will now be described with reference to a dual port memory first-in first-out (FIFO) circuit wherein port A is a write port and port B is a read port. Reference is made to FIG. 2 which is a timing diagram for operation of the pseudo dual port memory 100 as a FIFO circuit. The read and write transactions are started on the same clock cycle in FIG. 2; however, the actual start of the read transaction is delayed by one clock cycle because, in the illustrated embodiment, writes are given priority. It is to be understood that reads could be given priority if desired.

The write data (w0, w1, w2, w3, . . .) is cached in the data input register 104, and then clocked out when it has its turn on the interface to the memory 102. Caching the write data makes the Port A, the write port for a FIFO circuit, appear as a no-latency write port, instead of exhibiting the late late write property characteristic of pipelined zero bus turnaround RAMs. The memory 102 is shared on a cycle-by-cycle basis, i.e., transactions for one port are carried out on one series of clock cycles, for example the even clock cycles, and transactions for the other port are carried out on another series of interleaving clock cycles, for example the odd clock cycles.

While FIGS. 1 and 2 show Port A dedicated to read and Port B dedicated to write, the only requirement for operation of the pseudo dual port memory 100 of the present invention is that data must be written in bursts of transactions that are a multiple of X, i.e., mathematically, transactions are done in bursts of N×X×(M/X) where N is an integer equal to 1, 2, 3, 4, 5, . . . Thus, locations within the memory 102 cannot be skipped unless one or more wait cycles are inserted into an operation. Accordingly, for highest efficiency, reads and writes to the pseudo dual port memory 100 must be for bursts of X words with each word having M/X bits.

Figure 3:
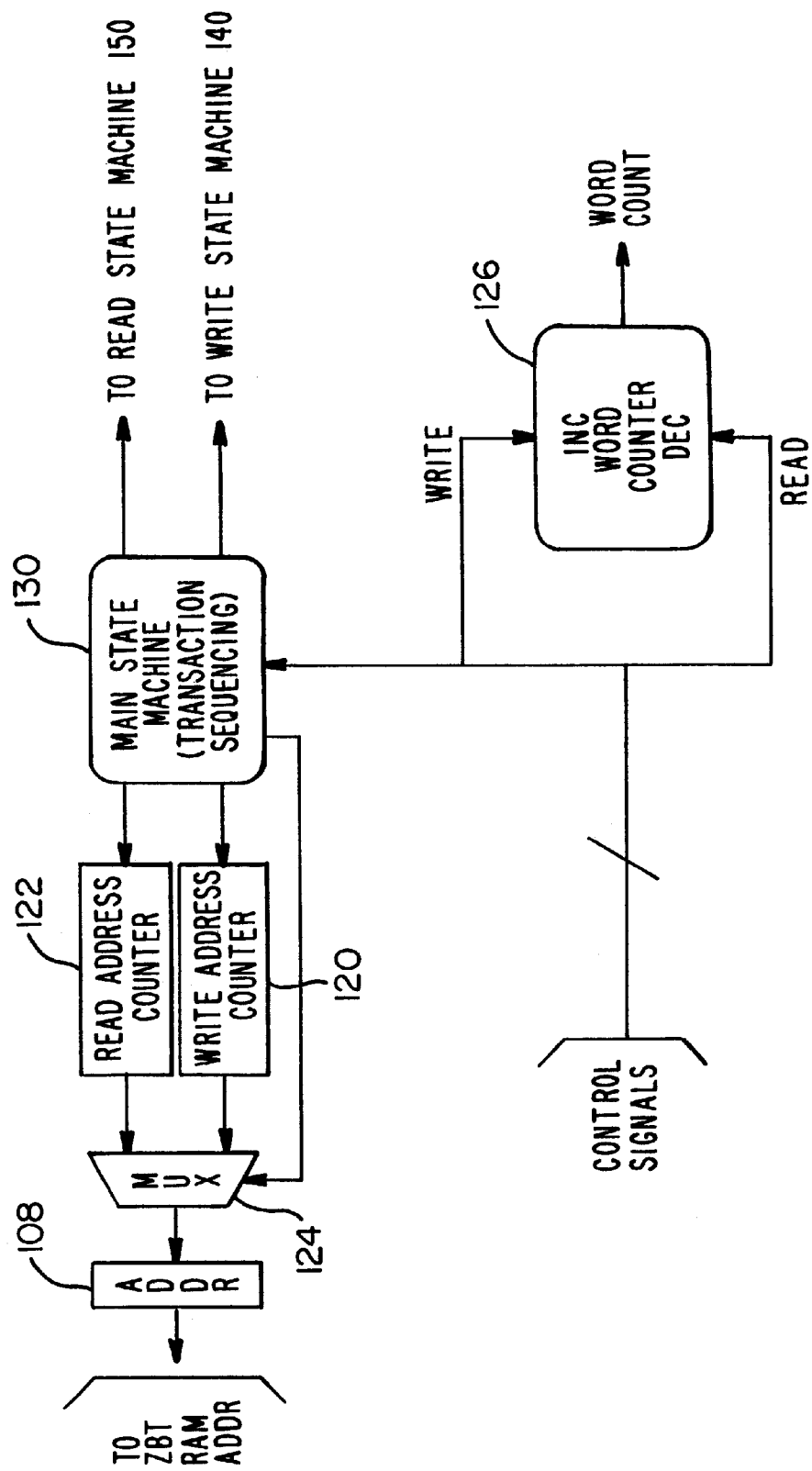
FIG. 3 is a schematic block diagram illustrating addressing circuitry for using the pseudo dual port memory of FIG. 1 to implement a pseudo dual port memory FIFO circuit.

For the dual port memory FIFO application, addressing is performed by two address counters, see FIG. 3, a write address counter 120 and a read address counter 122 with the contents of the write address counter 120 and the read address counter 122 being selectively controlled via a multiplexer 124 controlled by the control circuitry 110. Initially, the contents of the write address counter 120 equals the contents of the read address counter 122. There is also a word counter 126 which indicates the number of words which have been stored in the memory 102. The write and read address counters 120, 122 are incremented only when a write or read operation of the pseudo dual port memory 100 is performed, respectively. Thus, if five writes are performed with no reads, the word address counter 120 would equal 10 (two words of the pseudo dual port memory 100 equal one word of the RAM 102) while the read address counter 122 would still equal 0 and the word counter 126 would equal 5. If a read is then performed, the read address counter 122 would be equal to 1 to next read out the first written word and the word counter 126 would be decremented to 8 (two words of the pseudo dual port memory 100 equal one word of the RAM 102).

If simultaneous read and write operations are received, one is prioritized over the other, with write having the highest priority in the illustrated embodiment as previously noted. FIG. 2 shows operations according to clock cycles presuming two interleaved write and read operations. It is noted that the timing diagram of FIG. 2 shows the write transactions finishing before the data starts for the read transactions; however, this is due to pipeline delays, and the read data and write data may occur simultaneously in accordance with the present invention. The operations of FIG. 2 are described as follows:

1—load write address wa0 (increment the write address counter 120); load write data w0 (18 bits–½ of a 36 bit data word to be written into the memory 102) into the data input register 104A (increment the word counter 126);

2—load write data w1 (18 bits—½ of a 36 bit data word to be written into the memory 102) into the data input register 104B (increment the word counter 126); load read address ra0 (increment the read address counter 122);

3—write data w0 and w1 into the location in the memory 102 corresponding to the write address wa0; load write address wa1 (increment the write address counter 120); load write data w2 (18 bits–½ of a 36 bit data word to be written into the memory 102) into the data input register 104A (increment the word counter 126);

4—read the data r0 and r1 into the data output registers 106A, 106B; load read address ra1(increment the read address counter 122); load write address data w3 (18 bits–½ of a 36 bit data word to be written into the memory 102) into the data input register 104B (increment the word counter 126)

5—write data w2 and w3 into the location in the memory 102 corresponding to the write address wa1; read out read data r0 from the data output register 106A (decrement the word counter 126);

6—read out read data r1 from the data output register 106B (decrement the word counter 126); read the data r2 and r3 into the data output registers 106A, 106B;

7—read out read data r2 from the data output register 106A (decrement the word counter 126);

8—read out read data r3 from the data output register 106B (decrement the word counter 126).

As will be apparent to those skilled in the art, the exact times or triggers for incrementing the counters 120,122 and incrementing and decrementing the word counter126 can be selected in a variety of ways. Also, multiple increments and decrements can be performed on the word counter 126 depending upon the size of the words being used by the pseudo dual port memory 100, i.e., if each word of the memory 102 holds two words for the pseudo dual port memory 100, then two increments/decrements can be performed at one time; if each word of the memory 102 holds four words for the pseudo dual port memory 100 then four increments/decrements can be performed at one time; and so forth.

Figure 4:
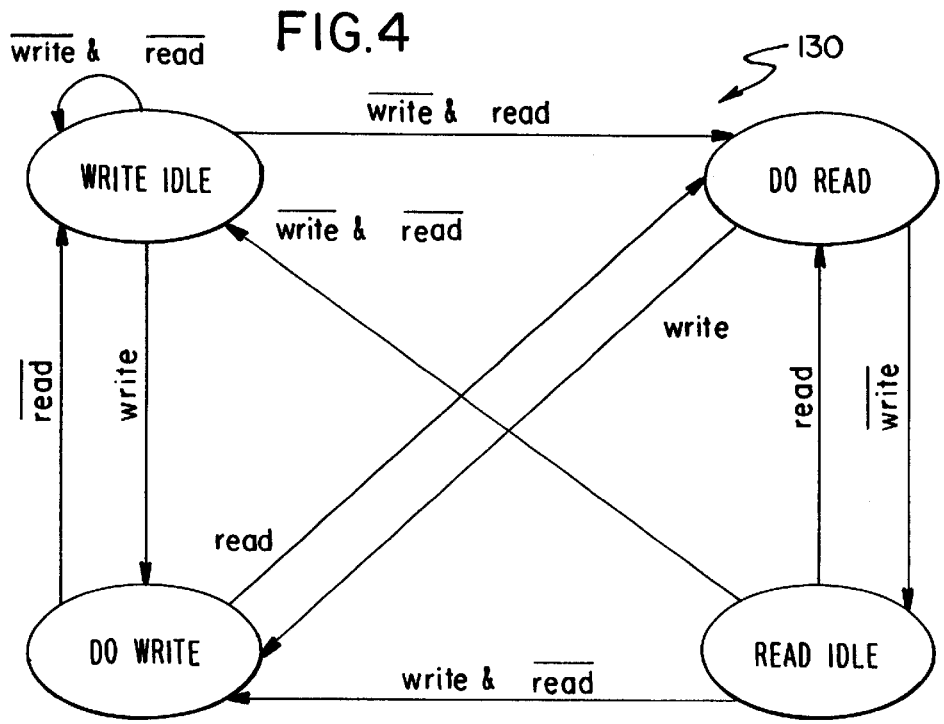
FIG. 4 is a diagram of a main state machine of FIG. 3 for implementing a pseudo dual port memory FIFO circuit.

The state machines used to implement the pseudo dual port memory 100 are primarily responsible for transaction sequencing to the memory 102 and data pipeline control. The main state machine is responsible for sequencing reads and writes properly, so that there are no collisions between read and write data in the pipeline. See FIGS. 3 and 4 for the main state machine 130 for the illustrated FIFO embodiment. Data cycles are alternated to the memory 102, i.e., the data sequence has write and read cycles interleaved without delays in the middle. The main state machine for a pseudo dual port memory of the present invention also determines whether writes or reads get priority, with the main state machine 130 of the illustrated embodiment giving priority to writes. FIG. 4 shows the state transitions within the main state machine 130 for the FIFO embodiment.

Figure 5:
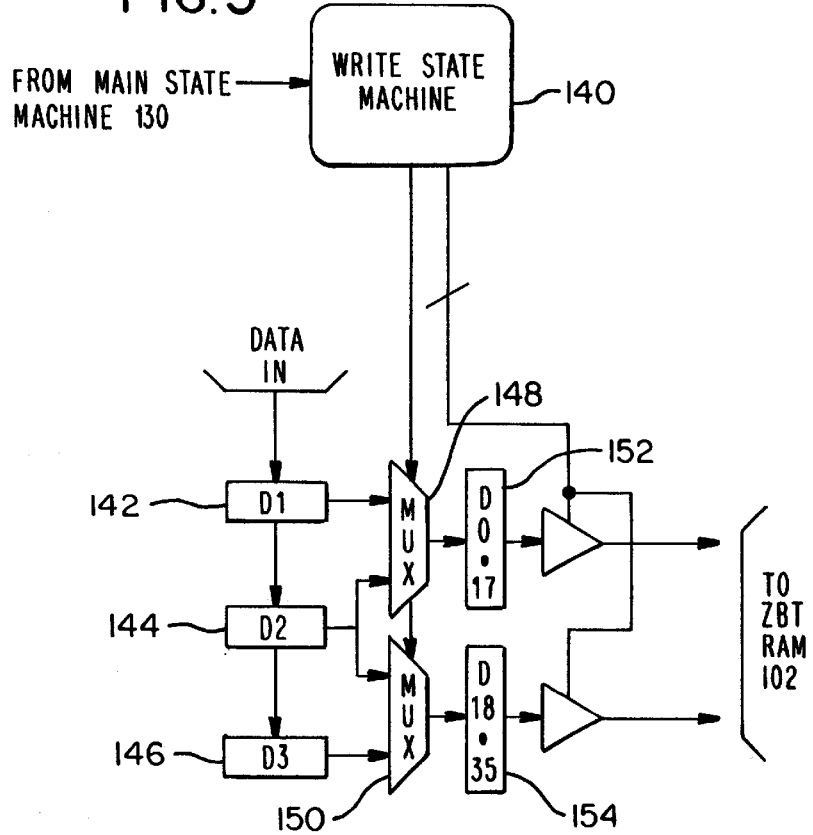
FIG. 5 is a schematic block diagram illustrating a write data pipeline for using the pseudo dual port memory of FIG. 1 to implement a pseudo dual port memory FIFO circuit.
Figure 6:
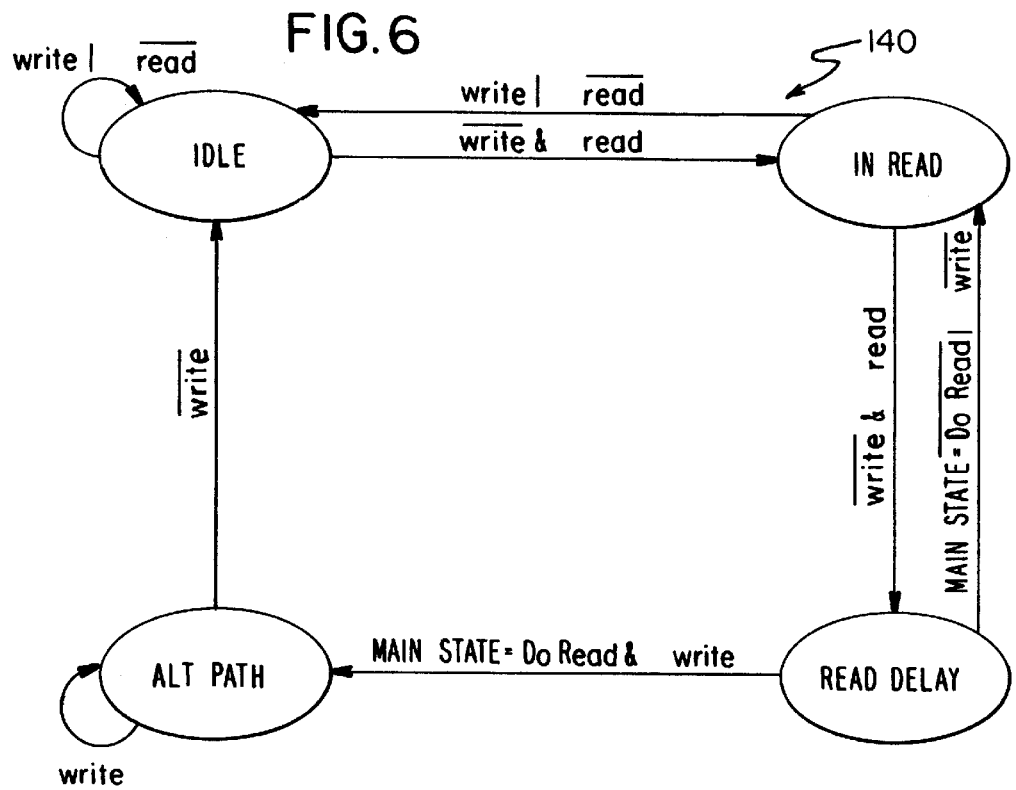
FIG. 6 is a diagram of a write state machine of FIG. 5 for implementing a pseudo dual port memory FIFO circuit.

The write state machine takes care of controlling the write data pipeline. See FIGS. 5 and 6 for the write state machine 140 for the illustrated pseudo dual port FIFO embodiment. As shown in FIG. 5, the write data pipeline consists of a first data input register 142 (D1), a second data input register 144 (D2) and a third data input register 146 (D3) that hold data temporarily while waiting to placed the data in the memory 102. If the write operation is able to start immediately, i.e., so that it is written as soon as it is requested, then the data is used from the first and second data input registers 142,144 which are selected using multiplexers 148,150 to write data from the first and second data input registers 142, 144 into data output registers 152, 154. If the write is delayed for a clock cycle due to a currently pending read operation, then the data is used from the second and third data input registers 144, 146 which are selected using the multiplexers 148, 150 to write data from the second and third data input registers into the data output registers 152, 154. The three register input arrangement including the data input registers 142, 144, 146 enables the pseudo dual port memory 100 to have the write port "always writable" such that no 'ready' signal is required to signify that it is ready to accept the data.

Figure 7:
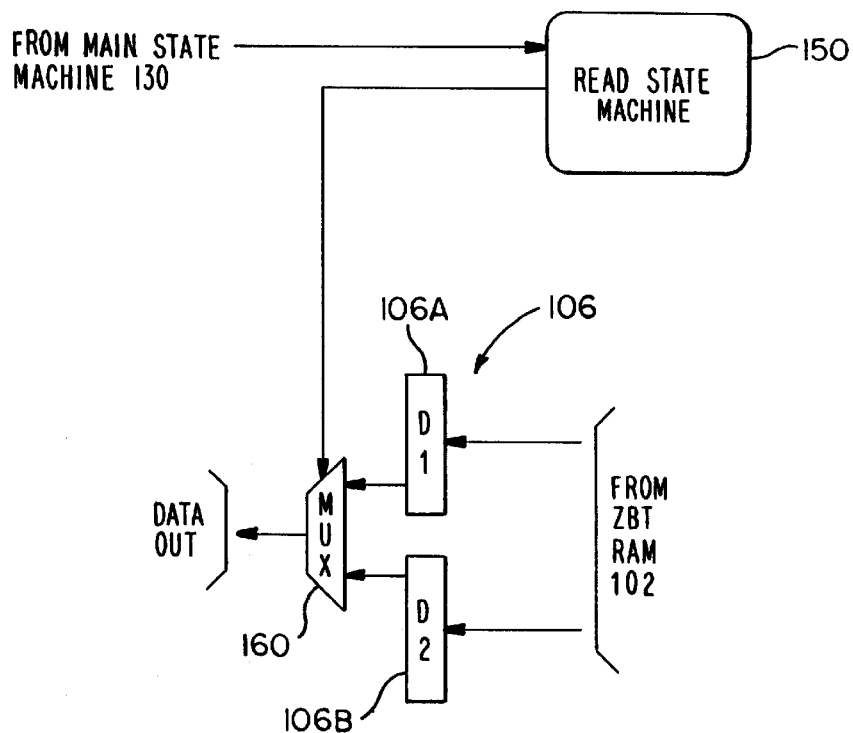
FIG. 7 is a schematic block diagram illustrating a read data pipeline for using the pseudo dual port memory of FIG. 1 to implement a pseudo dual port memory FIFO circuit.
Figure 8:
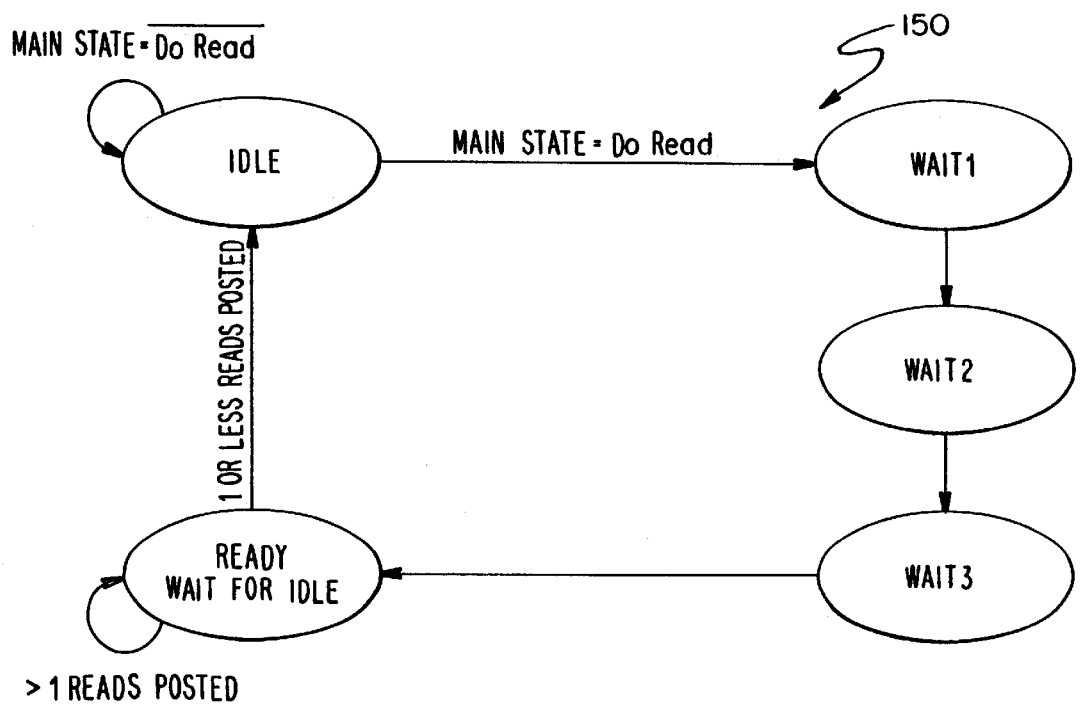
FIG. 8 is a diagram of a read state machine of FIG. 7 for implementing a pseudo dual port memory FIFO circuit.

The read data pipeline and read state machine 150 for the FIFO embodiment are illustrated in FIGS. 7 and 8, respectively. The read state machine 150 waits the proper number of clock cycles for the transaction to complete, and then asserts a ready signal indicating that the requested data, i.e., data stored in the memory 102 at the location corresponding to a read address, such as ra0 or ra1 in FIG. 2, is available. The ready signal is asserted a number of times corresponding to the number of posted reads to accomplish the read operation with very simple external interfacing. When a read has been completed from the memory 102, the data is latched in the data output register 106, illustrated in FIGS. 1 and 7 as a pair of registers 106A, 106B, and is multiplexed out of the registers 106A, 106B over the next two clock cycles when the ready signal is asserted by means of a multiplexer 160. The ready signal is used to hide collisions on the read data port of the memory 102. As previously described, in the illustrated embodiment writes are given priority, and there is an additional register 146 in the write pipeline so that writes will always appear to occur immediately. The read latency is much harder to hide, and requires either extra timing elements external to the state machines 130, 140, 150 or a signal to signify that the requested data is available, such as the ready signal.

Thus, the read and write state machines 150, 140 coordinate with the main state machine 130 to control the memory 102. Note that the embodiment of a FIFO circuit illustrated by the timing diagram of FIG. 2 shows the write transactions finishing before the data starts for the read transaction which is due to pipeline delays, and that the read data and write data may occur simultaneously in accordance with the present invention.

As described above, the pseudo dual port memory 100 can be constructed to provide two ports which can be used for either writing or reading the memory 100. For such generalized operation, Port B would be provided with a write data pipeline as shown in FIG. 5 and an associated write state machine. Similarly, Port A would be provided with a read data pipeline as shown in FIG. 7 and an associated read state machine.

Having thus described the invention of the present application in detail and by reference to preferred embodiments thereof, it will be apparent that modifications and variations are possible without departing from the scope of the invention defined in the appended claims.

What is claimed is:

1. A pseudo dual port memory comprising:
   a single port zero bus turnaround random access memory (RAM) storing M bit data words;
   at least one data input register providing at least two subgroups each subgroup having M/2 data input storage locations with M data input storage locations of said at least one data input register being coupled to M data input leads of said RAM;
   at least one data output register providing two subgroups each having M/2 data output storage locations with M data output storage locations of said at least one data output register being coupled to M data output leads of said RAM;
   memory addressing circuitry coupled to address leads of said RAM; and
   control circuitry coupled to said RAM, said at least one data input register and said at least one data output register, said control circuitry performing a data write by setting a write address within said memory addressing circuitry and writing a first data word having M/2 bits into a first one of said at least two subgroups of said at least one data input register on a first clock pulse, writing a second data word having M/2 bits into a second one of said at least two subgroups of said at least one data input register on a second clock pulse, and on a third clock pulse, writing data from said first and second ones of said at least two subgroups of said at least one data input register into a storage location in said RAM corresponding to said write address.

2. A pseudo dual port memory as claimed in claim 1 wherein said control circuitry further interleaves data reads with data writes by setting a read address within said memory addressing circuitry simultaneously with the writing of said second one of said at least two subgroups of said at least one data input register, and reading a data word having M bits from a location corresponding to said read address into said two subgroups of said at least one data output register on a fourth clock pulse.

3. A pseudo dual port memory as claimed in claim 2 wherein said pseudo dual port memory performs a FIFO operation and wherein said memory addressing circuitry comprises a write counter and a read counter, and for each write operation of said RAM said control circuitry increments said write counter, and for each read operation of said RAM said control circuitry increments said read counter.

4. A pseudo dual port memory as claimed in claim 3 further comprising a word counter and wherein:
   for each write operation of said RAM said control circuitry increments said word counter by 2, and for each read operation of said RAM said control circuitry decrements said word counter by 2.

5. A pseudo dual port memory as claimed in claim 1 wherein said at least one data input register comprises at least two data input registers each having M/2 data input storage locations.

6. A pseudo dual port memory as claimed in claim 1 wherein said at least one data input register comprises first, second and third data input registers each having M/2 data input storage locations, said first and second data input registers or said second and third data input registers being selectively coupled to M data input leads of said RAM.

7. A pseudo dual port memory as claimed in claim 1 wherein said at least one data output register comprises first and second data output registers each having M/2 data output storage locations, said first and second data output registers being coupled to M data output leads of said RAM.

8. A pseudo dual port memory comprising:
   a single port zero bus turnaround random access memory (RAM) storing M bit data words;
   at least one data input register having at least M data input storage locations and providing X subgroups each having M/X data input storage locations where X is a power of 2, M of said at least M data input storage locations of said at least one data input register being coupled to M data input leads of said RAM;
   at least one data output register having M data output storage locations and providing X subgroups each having M/X of said data storage locations, with said data output register being coupled to M data output leads of said RAM;
   memory addressing circuitry coupled to address leads of said RAM; and
   control circuitry coupled to said RAM, said at least one data input register and said at least one data output register, said control circuitry performing a data write by writing a first data word having M/X bits into a first one of said X subgroups of said at least M data storage locations of said at least one data input register on a first clock pulse, writing second through X data words each having M/X bits into second through X ones of said X subgroups of said at least M data storage locations of said at least one data input register on second through X clock pulses, setting a write address within said memory addressing circuitry on an X−1 clock pulse and writing data written into said first through X subgroups of said at least M data storage locations of said at least one data input register into a location corresponding to said write address of said RAM on an X+1 clock pulse.

9. A pseudo dual port memory as claimed in claim 8 wherein said control circuitry further interleaves data reads with data writes by setting a read address within said memory addressing circuitry on said X clock pulse and reading a data word having M bits from a location corresponding to said read address into said X subgroups of said at least one data output register on said X+2 clock pulse.

10. A pseudo dual port memory as claimed in claim 9 wherein said pseudo dual port memory performs a FIFO operation and wherein:

said memory addressing circuitry comprises a write counter and a read counter; and for each write operation of said RAM said control circuitry increments said write counter, and for each read operation of said RAM said control circuitry decrements said read counter.

11. A pseudo dual port memory as claimed in claim 10 further comprising a word counter and wherein:

for each write operation of said RAM said control circuitry increments said word counter by X counts, and for each read operation of said RAM said control circuitry decrements said word counter by X counts.

12. A method for operating a single port memory to form a pseudo dual port memory comprising the steps of:

providing a single port zero bus turnaround random access memory (RAM) storing M bit data words;

providing at least one data input register with at least two subgroups of data input storage locations each subgroup having M/2 data input storage locations;

coupling M storage locations of said at least one data input register to M data input leads of said RAM;

providing at least one data output register with two subgroups of data output storage locations each subgroup having M/2 data output storage locations;

coupling M data output storage locations of said at least one data output register to M data output leads of said RAM;

providing memory addressing circuitry;

setting a write address into said memory addressing circuitry on a first clock pulse;

writing a first data word having M/2 bits into a first subgroup of said at least one data input register on said first clock pulse;

writing a second data word having M/2 bits into a second subgroup of said at least one data input register on a second clock pulse; and writing said first and second data words into a storage location corresponding to said storage address within said RAM on a third clock pulse.

13. A method for operating a single port memory to form a pseudo dual port memory as claimed in claim 12 further comprising the steps of:

interleaving data reads with data writes by performing the steps of:

setting a read address into said memory addressing circuitry simultaneously with writing said second data word; and reading two M/2 data bit words from a location corresponding to said read address into said two subgroups of said at least one data output register on a fourth clock pulse.

14. A method for operating a single port memory to form a pseudo dual port memory as claimed in claim 13 wherein said method performs a FIFO operation and further comprising the steps of:

providing a write counter within said memory addressing circuitry for receiving said write address;

providing a read counter within said memory addressing circuitry for receiving said read address;

incrementing said write counter for each write operation of said RAM; and decrementing said read counter for each read operation of said RAM.

15. A method for operating a single port memory to form a pseudo dual port memory as claimed in claim 14 further comprising the steps of:

providing a word counter;

incrementing said word counter by 2 for each write operation of said RAM; and decrementing said word counter by 2 for each read operation of said RAM.

16. A method for operating a single port memory to form a pseudo dual port memory comprising the steps of:

providing a single port zero bus turnaround random access memory (RAM) storing M bit data words;

providing at least one data input register having at least M data input storage locations, said data input storage locations being divisible into X subgroups of said at least M data input storage locations where X is a power of 2;

coupling M of said at least M data input storage locations of said at least one data input register to M data input leads of said RAM;

providing at least one data output register having M data output storage locations, said M data output storage locations being divisible into X subgroups of data output storage locations;

coupling said M data output storage locations of said data output register to M data output leads of said RAM;

providing memory addressing circuitry coupled to address leads of said RAM;

writing a first data word having M/X bits into a first one of said X subgroups of said M data storage locations of said at least one data input register on said first clock pulse;

writing second through X data words each having M/X bits into second through X ones of said X subgroups of said M data storage locations of said at least one data input register on second through X clock pulses;

setting a write address within said memory addressing circuitry on an X−1 clock pulse; and writing data written into said first through X subgroups of said M data storage locations of said at least one data input register into a RAM location corresponding to said write address of said RAM on an X+1 clock pulse.

17. A method for operating a single port memory to form a pseudo dual port memory as claimed in claim 16 further comprising the steps of:

interleaving data reads with data writes by performing the steps of:

setting a read address within said memory addressing circuitry on said X clock pulse; and reading a data word having M bits from a location corresponding to said read address into said X subgroups of said at least one data output register on said X+2 clock pulse.

18. A method for operating a single port memory to form a pseudo dual port memory as claimed in claim 17 wherein said method performs a FIFO operation and further comprising the steps of:

providing a write counter within said memory addressing circuitry for receiving said write address;

providing a read counter within said memory addressing circuitry for receiving said read address;

incrementing said write counter for each write operation of said RAM; and decrementing said read counter for each read operation of said RAM.

19. A method for operating a single port memory to form a pseudo dual port memory as claimed in claim 18 further comprising the steps of:

providing a word counter;

incrementing said word counter by X counts for each write operation of said RAM; and decrementing said word counter by X counts for each read operation of said RAM.

* * * * *